United States Patent [19]
Moulton

[11] Patent Number: 6,154,020
[45] Date of Patent: Nov. 28, 2000

[54] TEST CIRCUIT AND METHOD FOR DETERMINING THE OPERATING STATUS OF A COAXIAL CABLE

[75] Inventor: Grant Moulton, Santa Rosa, Calif.

[73] Assignee: Next Level Communications, Rohnert Park, Calif.

[21] Appl. No.: 09/205,639

[22] Filed: Dec. 3, 1998

[51] Int. Cl.$^7$ .................................................. G01R 31/02
[52] U.S. Cl. .......................................... 324/72.5; 324/523
[58] Field of Search ...................... 324/543, 539, 324/525, 526, 72.5, 523; 348/192

[56] References Cited

U.S. PATENT DOCUMENTS

| | | | |
|---|---|---|---|
| 4,227,146 | 10/1980 | Hodge | 324/523 |
| 4,335,348 | 6/1982 | Reed et al. | 324/523 |
| 4,651,084 | 3/1987 | Welsh et al. | 324/523 |
| 4,947,469 | 8/1990 | Vokey et al. | 324/523 |
| 5,302,905 | 4/1994 | Crick | 324/613 |
| 5,488,306 | 1/1996 | Bonaccio | 324/539 |

*Primary Examiner*—Safet Metjahic
*Assistant Examiner*—Vincent Q. Nguyen
*Attorney, Agent, or Firm*—Morrison & Foerster/LLP

[57] ABSTRACT

A test circuit and method for determining the operating status of a coaxial cable, the coaxial cable including an internal conductor and an external conductor. The test circuit comprises a measurement terminal, a resistor coupled to the internal conductor adjacent a first end of the coaxial cable and the measurement terminal, a second resistor coupled to the internal conductor adjacent a second end of the coaxial cable and to a reference voltage, and a measurement device coupled to the measurement terminal for producing an output that is reflective of the operating status of the coaxial cable. In one embodiment, the measurement device comprises a voltage comparator logic output circuit. In another embodiment, the measurement device comprises an ohmmeter.

35 Claims, 2 Drawing Sheets

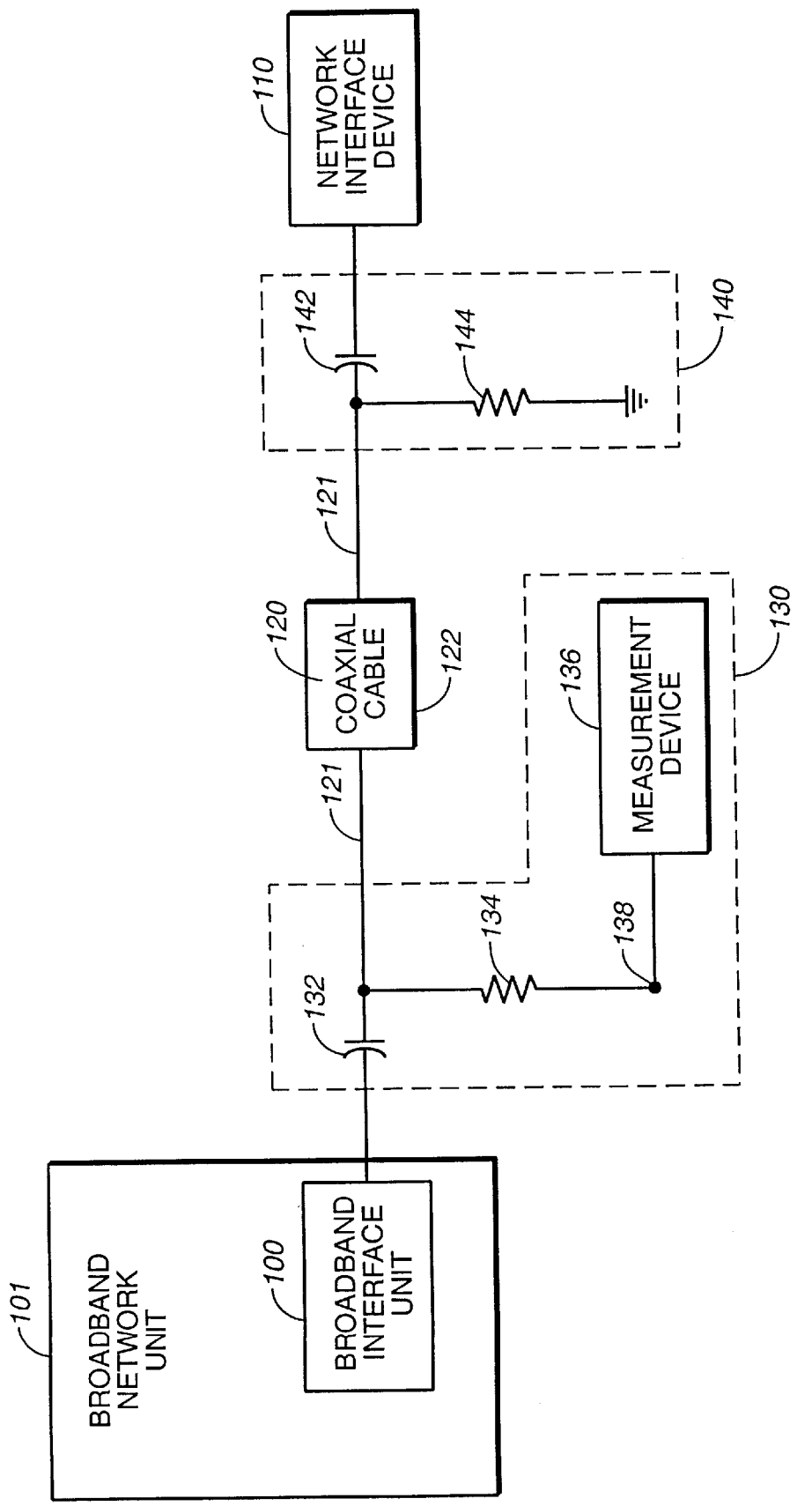
FIG._1

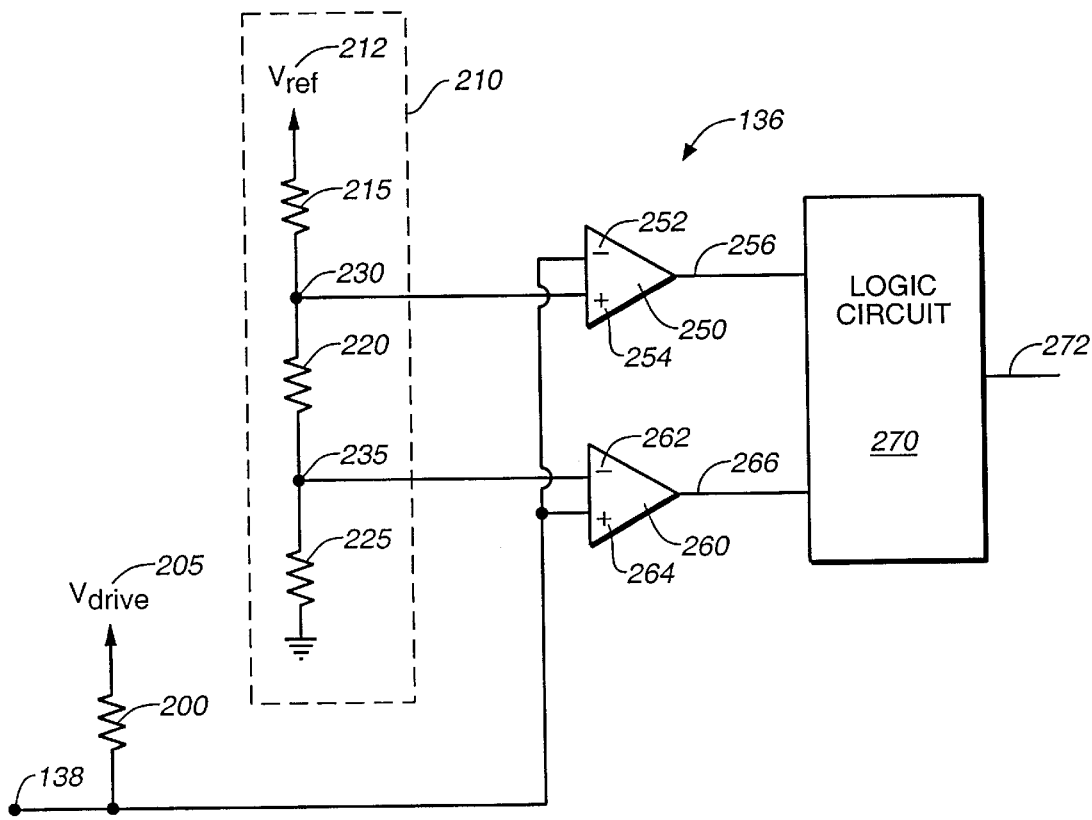
FIG._2
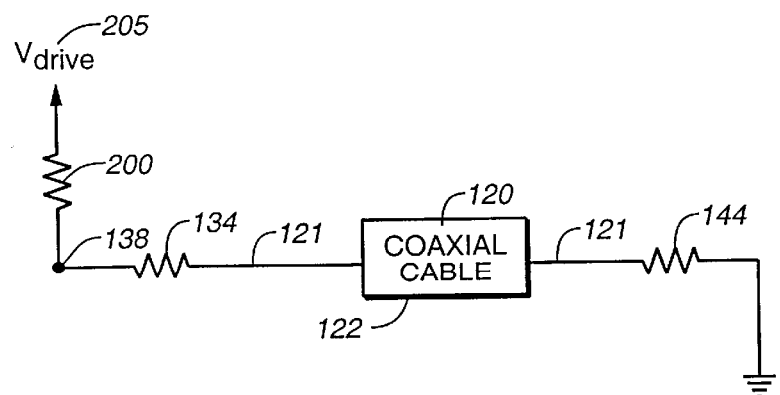
FIG._3

TEST CIRCUIT AND METHOD FOR DETERMINING THE OPERATING STATUS OF A COAXIAL CABLE

BACKGROUND OF THE INVENTION

1. Field of the Invention

This invention relates generally to test circuits and, in particular, to test circuits and related methods for determining the operating status of a coaxial cable.

2. Description of the Related Art

Coaxial cables are used to provide narrowband (telephone) and broadband (video and data) signals to residential subscribers. A typical optical network unit, also known as a broadband network unit (BNU), at a central location outside the residence provides service to 8 or 16 residences through these coaxial cables. BNUs also provide traditional telephone service to residences through twisted wire pairs.

Reliability and ease of maintenance are important for any phone system and for emerging video and data delivery systems. In the past, telephone companies have developed circuits that test twisted wire pairs that deliver traditional phone services. However, since the use of coaxial cables to deliver narrowband and broadband signals is relatively new, there has been a need for test circuits and related methods for testing the operating status of coaxial cables.

SUMMARY OF THE INVENTION

The present invention encompasses test circuits and related methods for determining the operating status of a coaxial cable. The coaxial cable includes an internal conductor and an external conductor. The internal conductor of the coaxial cable has a resistance. The test circuit comprises a measurement terminal, a resistor coupled to the internal conductor adjacent a first end of the coaxial cable and the measurement terminal, a second resistor coupled to the internal conductor adjacent a second end of the coaxial cable and to a reference voltage, and a measurement device coupled to the measurement terminal for producing an output that is reflective of the operating status of the coaxial cable.

The operating status of the coaxial cable is one of two mutually exclusive states at any one time. The two mutually exclusive states are (1) malfunction in the coaxial cable and (2) no malfunction in the coaxial cable. A malfunction indicates that the internal conductor of the coaxial cable is either short circuited or open circuited. As is known to those skilled in the art, an open circuit in the internal conductor of the coaxial cable may be, for example, caused by a cut or break in the internal conductor that electrically isolates the sections of the internal conductor on the opposite sides of the cut or break. Similarly, as is known to those skilled in the art, a short circuit in the internal conductor of the coaxial cable may be caused by an abnormal connection of relatively low impedance, whether made accidentally or intentionally, between the internal conductor and another point of different potential. A no malfunction, also referred to herein as normal operation, indicates that the internal conductor of the coaxial cable is neither short circuited nor open circuited.

In a presently preferred embodiment of the invention, the measurement device comprises a voltage comparator logic output circuit. In an alternative embodiment, the measurement device comprises an ohmmeter.

The present invention is explained in more detail below with reference to the drawings.

BRIEF DESCRIPTION OF THE DRAWINGS

FIG. 1 is a block schematic diagram of a test circuit of a presently preferred embodiment of the invention coupled to a coaxial cable system.

FIG. 2 is a schematic diagram of the presently preferred embodiment of the measuring device of the test circuit of FIG. 1.

FIG. 3 is a schematic diagram of the coaxial cable and three primary resistors of the test circuit of the presently preferred embodiment of the invention.

DETAILED DESCRIPTION OF THE PREFERRED EMBODIMENT

The present invention comprises novel test circuits and related methods for determining the operating status of a coaxial cable. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

In a presently preferred embodiment of the invention, the coaxial cable 120 is coupled between a network interface device (NID) 110 and a broadband interface unit (BIU) 100 of a broadband network unit (BNU) 101. The test circuit comprises BIU end components 130 at a BIU end of the coaxial cable 120 and NID end components 140 at an NID end of the coaxial cable 120. The test circuit comprising the BIU end components 130 and the NID end components 140 is coupled to the coaxial cable 120 and determines the operating status of the coaxial cable 120. The coaxial cable 120 includes an external conductor 122 and an internal conductor 121, each of which has a resistance. The external conductor 122 forms the return path for signals transmitted on the internal conductor 121.

The BIU end components 130 include a capacitor 132 in series between the internal conductor 121 of coaxial cable 120 and the BIU 100, a resistor 134 coupled between the internal conductor 121 of coaxial cable 120 and a measurement terminal 138, and a measurement device 136 coupled to measurement terminal 138. The measurement device 136 may, for example, comprise a voltage comparator logic output circuit or an ohmmeter. Furthermore, the measurement device 136 may, for example, be portable and detachably coupled to the measurement terminal 138. Alternatively, measurement device 136 may be non-portable and fixedly coupled to the measurement terminal 138.

The NID end components 140 include a capacitor 142 in series between the internal conductor 121 of coaxial cable 120 and the NID 110 and a resistor 144 coupled to the internal conductor 121 of coaxial cable 120 and ground.

Capacitors 132 and 142 provide DC isolation for the internal conductor 121 of the coaxial cable 120 as well as significant protection from voltage surges to devices coupled to coaxial cable 120, such as devices within the residence to which service is provided via the coaxial cable 120. It is to be noted that the DC isolation provided by capacitors 132 and 142 does not prevent coaxial cable 120 from transferring AC signals between the BIU 100 and the NID 110. Thus, the test circuit comprising the BIU end components 130 and the NID end components 140 can determine the operating status of the coaxial cable 120 even while the coaxial cable 120 transfers AC signals between the BIU 100 and the NID 110.

Each of resistors 134 and 144 has a resistance value that is substantially greater than the sum of the resistance of the internal conductor 121 and the resistance of the external conductor 122 of coaxial cable 120. In preferred embodiments, the resistance of each of resistors 134 and 144 is approximately 9 or more times greater than the sum of the resistance of the internal conductor 121 and the external conductor 122. More specifically, in preferred embodiments, the resistance of each of resistors 134 and 144 is approximately 100 or more times greater than the sum of the resistance of the internal conductor 121 and the external conductor 122. In some embodiments, the resistance of each of resistors 134 and 144 is approximately 250 or 350 times greater than the sum of the resistance of the internal conductor 121 and the resistance of the external conductor 122. In a preferred embodiment, the resistance values of resistors 134 and 144 are substantially equal. In one embodiment, resistors 134 and 144 each have a resistance value of 10 KΩ. Capacitors 132 and 142 are preferably high voltage capacitors. In one embodiment capacitors 132 and 142 each have a capacitance of 0.001 $\mu$F.

Referring to FIG. 2, there is shown a schematic diagram of the measurement device 136, which comprises a voltage comparator logic output circuit. Measurement device 136 includes a drive voltage dividing resistor 200, a voltage dividing circuit 210, voltage comparators 250 and 260, and a logic circuit 270. Measurement terminal 138 is connected to the negative terminal 252 of voltage comparator 250 and the positive terminal 264 of voltage comparator 260. Measurement terminal 138 is also coupled to the drive voltage dividing resistor 200, which is in turn coupled to a drive voltage 205. In a preferred embodiment, drive voltage dividing resistor 200 has a resistance value that is substantially the same as that of resistors 134 and 144. For example when resistors 134 and 144 have resistance values of 10 KΩ, then the drive voltage dividing resistor 200 will also be selected to have a resistance of 10 KΩ.

FIG. 3 shows the coaxial cable and the resistors 134, 144, and 200 coupled thereto. When voltage dividing resistor 200 has substantially the same resistance as resistors 134 and 144 and when each of resistors 134, 144, and 200 has a resistance that is substantially greater than that of the internal conductor 121 of the coaxial cable 120, the voltage at measurement terminal 138 will be approximately equal to (1) the drive voltage 205 when there is an open circuit in the internal conductor 121 of the coaxial cable 120, (2) one-half the drive voltage 205 when there is a short circuit in the internal conductor 121 of coaxial cable 120, and (3) two-thirds the drive voltage when the coaxial cable 120 is operating normally. The voltage at measurement terminal 138 is used to determine the operating status of the coaxial cable as the voltage at measurement terminal 138 depends on the operating status of the internal conductor 121 of the coaxial cable 120. More specifically, the voltage at measurement terminal 138 is used by comparators 250 and 260 to determine the operating status of the internal conductor 121 of the coaxial cable 120.

Referring to FIG. 2, the voltage dividing circuit 210 supplies two different input reference voltages. A first input reference voltage is provided to a first reference node 230. A second input reference voltage is provided to a second reference node 235. The first reference node 230 is coupled to a positive terminal 254 of a first voltage comparator 250, and the second reference node 235 is coupled to a negative terminal 262 of a second voltage comparator 260. The voltage dividing circuit 210 is comprised of resistors 215, 220, and 225 coupled in series. Resistor 215 is coupled between reference voltage source 212 and the first reference node 230. Resistor 220 is coupled between the first and second reference nodes 230 and 235. Resistor 225 is coupled between the second reference node 235 and ground 240.

The values of reference voltage 212 and resistors 215, 220, and 225 are selected so that the outputs of the first voltage comparator 250 and the second voltage comparator 260 depend on the operational status of coaxial cable 120. More specifically, in a present embodiment of the invention, the above values are selected such that (1) when there is a short or open in the internal conductor 121 of coaxial cable 120, the output of at least one of the first voltage comparator 250 and the second voltage comparator 260 is low and (2) when there is no short or open in the internal conductor 121 of coaxial cable 120, the outputs of both the first voltage comparator 250 and the second voltage comparator 260 are high. In a presently preferred embodiment of the invention, the values of reference voltage 212 and resistors 212, 220 and 225 are chosen such that (1) when there is a short circuit in the internal conductor 121 of coaxial cable 120, the voltages at the first reference node 230 and the second reference node 235 are greater than the voltage at measurement terminal 138, (2) when there is an open circuit in the internal conductor of coaxial cable 120, the voltages at the first reference node 230 and the second reference node 235 are less than the voltage at measurement terminal 138, and (3) when the coaxial cable 120 is operating normally, i.e., the internal conductor 121 of coaxial cable 120 is neither short nor open circuited, the voltage at the first reference node 230 is greater than the voltage at measurement terminal 138 whereas the voltage at the second reference node 235 is less than the voltage at measurement terminal 138. Reference voltage 212 is preferably equal to drive voltage 205, which is 5 volts in the presently preferred embodiment of the invention.

As noted above, the voltage values at measurement terminal 138 will only be approximately, but not exactly, equal to the drive voltage 205 and the above mentioned fractions thereof. This is due to, among other things, (1) the fact that the internal conductor 121 is assumed to have no resistance when estimating the expected voltages whereas in fact it has some finite, but relatively small resistance, (2) possible electrical connections between the internal conductor 121 and the external conductor 122 of coaxial cable 120 due to oxide growth between these conductors over time which may affect the voltage at measurement terminal 138, and (3) inaccuracies in the resistance value of the resistors in the circuit. (It is to be noted that the growth of oxides between the internal conductor 121 and the external conductor 122 will probably not be immediately detected as a short circuit, because, at least initially, it will likely not have a sufficiently low resistance to short circuit the coaxial cable 120. Instead, the oxide growth is likely to cause non-linearity and inter-modulation of the desired signals transmitted via the coaxial cable 120 before it eventually causes a short circuit between the internal conductor 121 and the external conductor 122.) As a result of these inaccuracies, the possible voltage at measurement terminal 138 may be at least slightly different from the drive voltage 205, two thirds of the drive voltage 205, and one half of the drive voltage 205 under open, normal and short conditions, respectively. The reference voltage 212 and the resistance values of resistors 215, 220, and 225 are selected to accommodate variations in the circuit parameters of the coaxial cable 120 in order to allow the test circuit to determine the true operating status of the coaxial cable 120 even in the presence of the aforementioned inaccuracies.

As explained above, growth of oxides, electrolytes, or other chemicals between the internal and external conductors 121 and 122 of coaxial cable 120 can create an electrical connection between these two conductors thus affecting the readings of the test circuit. In order to minimize such growths, in a preferred embodiment of the present invention, the drive voltage 205 is maintained at zero volts when the coaxial cable is not being tested. It is driven to a desired drive voltage level of 5 volts when the coaxial cable is to be tested.

To account for the aforementioned inaccuracies and to obtain the desired output from comparators 250 and 260 under the three different scenarios of short, open and normal circuits, the reference voltage 212 and the resistance values of resistors 215, 220 and 225 are selected such that the voltage at the first reference node 230 is slightly above two thirds the driving voltage and the voltage at the second reference node 235 is slightly below two thirds the driving voltage 205. In a presently preferred embodiment, the voltage at the first reference node 230 is approximately one twelfth plus two thirds the drive voltage 205 and the voltage at second reference node 235 is approximately two third minus one twelfth the driving voltage 205. In other words, the voltages at the first and second reference nodes 230 and 235 are approximately three fourths the driving voltage 205 and seven twelfths the driving voltage 205, respectively. Such values can be attained by selecting appropriate values for the reference voltage 212 and the resistors 215, 220, and 225 which can be done by those skilled in the art who will recognize that:

$$V230=((R220+R225)/(R215+R220+R225))*V212; \text{ and}$$

$$V235=((R225)/(R215+R220+R225))*V212;$$

where V212 is the reference voltage 212; V230 is the voltage at the first reference node 230; V235 is the voltage at the second reference node 235; R215 is the resistance of resistor 215; R220 is the resistance of resistor 220; and R225 is the resistance of resistor 225. (It is to be noted that the above calculations are based on the assumption that there is no bias current into comparators 250 and 260.)

Below is an explanation of the operation of the first and second voltage comparators 250 and 260, under different operating conditions of the internal conductor 121 of coaxial cable 120, when the voltages at reference voltage points 230 and 235 are the presently preferred values of three fourths and seven twelfths of the drive voltage 205, respectively.

If the internal conductor 121 of the coaxial cable 120 is short circuited, the voltage at measurement terminal 138 will equal approximately one half the drive voltage 205. The output 256 of voltage comparator 250 will be high because the voltage at the positive terminal 254, three fourths of the drive voltage 205, is greater than the voltage at the negative terminal 252, one half of the drive voltage 205. The output 266 of voltage comparator 260 will be low because the voltage at the negative terminal 262, seven twelfths of the drive voltage 205, is greater than the voltage at the positive terminal 264, one half of the drive voltage 205.

If the internal conductor 121 of the coaxial cable 120 is open circuited, the voltage at measurement terminal 138 will be approximately equal to the drive voltage 205. The output 256 of voltage comparator 250 will be low because the voltage at the positive terminal 254, three fourths of the drive voltage 205, is less than the voltage at the negative terminal 252, which is approximately equal to the drive voltage 205. The output 266 of voltage comparator 260 will be high because the voltage at the positive terminal 264, which is approximately equal to the drive voltage 205, is greater than the voltage at the negative terminal 262, seven twelfths of the drive voltage.

If the internal conductor 121 of coaxial cable 120 is in a normal operating condition, the voltage at measurement terminal 138 will be equal to approximately two thirds of the drive voltage 205. The output 256 of voltage comparator 250 will be high because the voltage at the positive terminal 254, three fourths of the drive voltage 205, is greater than the voltage at the negative terminal 252, approximately two thirds of the drive voltage 205. The output 266 of voltage comparator 260 will be high because the voltage at the positive terminal 264, approximately two thirds of the drive voltage 205, is greater than the voltage at the negative terminal 262, seven twelfths of the drive voltage 205.

The outputs 256 and 266 of voltage comparators 250 and 260 are sent to a logic circuit 270. In a present embodiment of the invention, the logic circuit 270 acts as an AND gate. In the case of a short or open circuit in the coaxial cable 120, the logic circuit output 272 will be low since one of the inputs from voltage comparator 250 or voltage comparator 260 will be low. If the coaxial cable is operating normally, the logic circuit output 272 will be high since both inputs from voltage comparator 250 and voltage comparator 260 will be high. Thus, the test circuit of the present invention will produce a one bit output reflecting the operating status of the coaxial cable 120. A high output, e.g., a one bit output of 1, will indicate normal operation whereas a low output, e.g., a one bit output of 0, will indicate abnormal operation (short or open circuit).

In another embodiment, the logic circuit 270 may produce one of a number of different multi-bit outputs, instead of a one bit output as in the embodiment above, at any given time. Each of the multi-bit outputs reflects a short, open, or normal condition in the internal conductor 121 of the coaxial cable 120.

In an alternative embodiment, the measurement device 136 is an ohmmeter. In the case of a short circuit in the coaxial cable 120, the ohmmeter measures a resistance value approximately equal to the resistance value of resistor 134. In the case of an open circuit in the coaxial cable 120, the ohmmeter measures a very high resistance, i.e., one at or near infinity. In the case where the coaxial cable 120 is operating normally, the ohmmeter measures a resistance approximately equal to the sum of the resistance values of resistors 134 and 144.

In one embodiment, resistor 134 and resistor 144 each have a value of 10 KΩ. In the case of a short circuit in the coaxial cable 120, the ohmmeter measures a resistance of approximately 10 KΩ. In the case of an open circuit, the ohmmeter measures a very high resistance, i.e., one at or near infinity. If the coaxial cable 120 is operating normally, the ohmmeter measures a resistance of approximately 20 KΩ.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the appended claims.

What is claimed is:

1. A test circuit for use with a measurement device to determine the operating status of a coaxial cable, the coaxial cable including an internal conductor and an external conductor, wherein each of the internal conductor and the external conductor has a resistance, the test circuit comprising:
   a measurement terminal for coupling to the measurement device;
   a first resistor coupled to the internal conductor adjacent a first end of the coaxial cable and to said measurement terminal, said first resistor having a resistance that is substantially greater than the sum of the resistance of the internal conductor and the resistance of the external conductor; and
   a second resistor coupled to the internal conductor adjacent a second end of the coaxial cable and to a reference node, said second resistor having a resistance that is substantially greater than the sum of the resistance of the internal conductor and the resistance of the external conductor;
   wherein a signal at the measurement terminal provides sufficient signal information for producing an output that is reflective of the operating status of the coaxial cable in normal, short and open conditions.

2. The test circuit of claim 1, wherein said reference node is at ground potential.

3. The test circuit of claim 1, wherein said first resistor and said second resistor each has a resistance that is at least approximately 9 times greater than the sum of the resistance of the internal conductor and the resistance of the external conductor.

4. The test circuit of claim 1, wherein said first resistor and said second resistor each has a resistance that is at least approximately 100 times greater than the sum of the resistance of the internal conductor and the resistance of the external conductor.

5. The test circuit of claim 1, further comprising a voltage drive dividing resistor coupled to a drive voltage terminal and the measurement terminal.

6. The test circuit of claim 1, wherein said measurement signal is one of the voltage at the measurement terminal with respect to the reference node and the resistance between the measurement terminal and the reference node.

7. A test circuit for determining the operating status of a coaxial cable, the coaxial cable including an internal conductor and an external conductor, wherein each of the internal conductor and the external conductor has a resistance, the test circuit comprising:
   a measurement terminal;
   a first resistor coupled to the internal conductor adjacent a first end of the coaxial cable and to said measurement terminal;
   a second resistor coupled to the internal conductor adjacent a second end of the coaxial cable and to a reference node; and
   a measuring device coupled to the measurement terminal for producing an output that is reflective of the operating status of the coaxial cable;
   wherein a signal at the measurement terminal provides sufficient signal information for producing the output that is reflective of the operating status of the coaxial cable in normal, short and open conditions.

8. The test circuit of claim 7, wherein said first resistor and said second resistor each has a resistance that is substantially greater than the sum of the resistance of the internal conductor and the resistance of the external conductor.

9. The test circuit of claim 7, wherein said measurement device comprises an ohmmeter.

10. The test circuit of claim 7, wherein said first resistor and said second resistor each has a resistance that is at least approximately 9 times greater than the sum of the resistance of the internal conductor and the resistance of the external conductor.

11. The test circuit of claim 7, wherein said first resistor and said second resistor each has a resistance that is at least approximately 100 times greater than the sum of the resistance of the internal conductor and the resistance of the external conductor.

12. The test circuit of claim 7, wherein the measurement device is fixedly coupled to the measurement terminal.

13. The test circuit of claim 7, wherein the first and second resistors are fixedly coupled to the internal conductor.

14. The test circuit of claim 7, wherein, when the coaxial cable is operating normally, the output that is reflective of the operating status of the coaxial cable may be obtained while the coaxial cable transmits alternating current (AC) signals.

15. The test circuit of claim 7, wherein said measurement signal is one of the voltage at the measurement terminal with respect to the reference node and the resistance between the measurement terminal and the reference node.

16. The test circuit of claim 15, wherein the reference node is at ground potential.

17. The test circuit of claim 7, wherein said measurement device comprises a voltage comparator logic output circuit.

18. The test circuit of claim 17, wherein said voltage comparator logic output circuit comprises:
   a drive voltage dividing resistor coupled in series with said first resistor and said second resistor;
   a voltage dividing circuit having a first reference node with a first reference voltage and a second reference node with a second reference voltage;
   a first voltage comparator having a first input terminal, a second input terminal, and an output terminal, wherein the first input terminal is coupled to the measurement terminal and the second input terminal is coupled to said first reference node, said first voltage comparator comparing the voltage at the measurement terminal with the first reference voltage;
   a second voltage comparator having a first input terminal, a second input terminal and an output terminal, wherein the second input terminal is coupled to the measurement terminal and the first input terminal is coupled to said second reference node, said second voltage comparator comparing the voltage at the measurement terminal with the second reference voltage; and
   a logic circuit coupled to the outputs of said first and second voltage comparators.

19. The test circuit of claim 18 wherein said voltage dividing circuit comprises:
   an input reference voltage;
   a first voltage dividing resistor coupled to the input reference voltage and said first reference node;
   a second voltage dividing resistor coupled to said first reference node and said second reference node; and
   a third voltage dividing resistor coupled to said second reference node and to ground.

20. A method for testing the operating status of a coaxial cable, the coaxial cable having an internal conductor and an external conductor, wherein the external conductor is coupled to a reference voltage, said method comprising:

coupling a first resistor to a measurement terminal and to the internal conductor adjacent a first end of the coaxial cable;

coupling a second resistor to a reference node and to the internal conductor adjacent a second end of the coaxial cable; and measuring a signal at the measurement terminal to determine the operating status of the coaxial cable, wherein the signal at the measurement terminal provides sufficient signal information for producing an output that is reflective of the operating status of the coaxial cable in normal, short and open conditions.

21. The method of claim 20, wherein said measuring includes measuring the resistance between the measurement terminal and the reference node.

22. The method of claim 20, wherein said measuring includes comparing the voltage at the measurement terminal with a first voltage at a first reference node and a second voltage at a second reference node.

23. The method of claim 20, wherein measuring includes measuring one of the voltage at the measurement terminal with respect to the reference node and the resistance between the measurement terminal and the reference node.

24. The method of claim 20, wherein said measuring includes coupling a measurement device to the measurement terminal.

25. The method of claim 24, wherein said measuring includes coupling an ohmmeter to the measurement terminal.

26. The method of claim 24, wherein said measuring includes coupling a voltage comparator logic circuit to the measurement terminal.

27. A test circuit for use with a measurement device to determine the operating status of a coaxial cable, the coaxial cable including an internal conductor and an external conductor, wherein each of the internal conductor and the external conductor has a resistance, the test circuit comprising:

a measurement terminal for coupling to the measurement device;

a first resistor coupled to the internal conductor adjacent a first end of the coaxial cable and to said measurement terminal, said first resistor having a resistance that is substantially greater than the sum of the resistance of the internal conductor and the resistance of the external conductor; and a second resistor coupled to the internal conductor adjacent a second end of the coaxial cable and to a reference node, said second resistor having a resistance that is substantially greater than the sum of the resistance of the internal conductor and the resistance of the external conductor;

wherein the voltage at the measurement node with respect to the reference node is compared with first and second reference voltages to produce an output that is reflective of the operating status of the coaxial cable.

28. A test circuit for determining the operating status of a coaxial cable, the coaxial cable including an internal conductor and an external conductor, wherein each of the internal conductor and the external conductor has a resistance, the test circuit comprising:

a measurement terminal;

a first resistor coupled to the internal conductor adjacent a first end of the coaxial cable and to said measurement terminal;

a second resistor coupled to the internal conductor adjacent a second end of the coaxial cable and to a reference node; and a measuring device coupled to the measurement terminal for producing an output that is reflective of the operating status of the coaxial cable;

wherein the measuring device compares a signal at the measurement terminal with first and second reference signals to produce the output that is reflective of the operating status of the coaxial cable.

29. The test circuit of claim 28, wherein the measurement device is fixedly coupled to the measurement terminal.

30. The test circuit of claim 28, wherein the first and second resistors are fixedly coupled to the internal conductor.

31. The test circuit of claim 28, wherein, when the coaxial cable is operating normally, the output that is reflective of the operating status of the coaxial cable may be obtained while the coaxial cable transmits alternating current (AC) signals.

32. The test circuit of claim 28, wherein said measurement device comprises a voltage comparator logic output circuit, said voltage comparator logic output circuit comprising:

a drive voltage dividing resistor coupled in series with said first resistor and said second resistor;

a voltage dividing circuit having a first reference node with a first reference voltage and a second reference node with a second reference voltage;

a first voltage comparator having a first input terminal, a second input terminal, and an output terminal, wherein the first input terminal is coupled to the measurement terminal and the second input terminal is coupled to said first reference node, said first voltage comparator comparing the voltage at the measurement terminal with the first reference voltage;

a second voltage comparator having a first input terminal, a second input terminal and an output terminal, wherein the second input terminal is coupled to the measurement terminal and the first input terminal is coupled to said second reference node, said second voltage comparator comparing the voltage at the measurement terminal with the second reference voltage; and a logic circuit coupled to the outputs of said first and second voltage comparators.

33. The test circuit of claim 32 wherein said voltage dividing circuit comprises:

an input reference voltage;

a first voltage dividing resistor coupled to the input reference voltage and said first reference node;

a second voltage dividing resistor coupled to said first reference node and said second reference node; and a third voltage dividing resistor coupled to said second reference node and to ground.

34. A method for testing the operating status of a coaxial cable, the coaxial cable having an internal conductor and an external conductor, wherein the external conductor is coupled to a reference voltage, said method comprising:

coupling a first resistor to a measurement terminal and to the internal conductor adjacent a first end of the coaxial cable;

coupling a second resistor to a reference node and to the internal conductor adjacent a second end of the coaxial cable; and measuring a signal at the measurement terminal to determine the operating status of the coaxial cable, wherein the signal at the measurement terminal is compared with first and second reference signals to provide an output that is reflective of the operating status of the coaxial cable.

35. The method of claim 34, wherein said measuring includes comparing the voltage at the measurement terminal with a first reference voltage at a first reference node and a second reference voltage at a second reference node.

* * * * *